(12) United States Patent
Ding (10) Patent No.: US 10,516,367 B2
(45) Date of Patent: Dec. 24, 2019

(54) LOGIC CONTROL CIRCUIT

(71) Applicant: Advanced Semiconductor Engineering, Inc., Kaohsiung (TW)

(72) Inventor: Jaw-Ming Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/887,609

(22) Filed: Feb. 2, 2018

(65) Prior Publication Data
US 2019/0245487 A1 Aug. 8, 2019

(51) Int. Cl.
*H03F 1/02* (2006.01)
*H03F 3/19* (2006.01)
*H03F 3/24* (2006.01)
*H03K 19/21* (2006.01)

(52) U.S. Cl.
CPC ............ *H03F 1/0205* (2013.01); *H03F 3/19* (2013.01); *H03F 3/24* (2013.01); *H03K 19/21* (2013.01)

(58) Field of Classification Search
USPC .................................. 330/250, 302, 285, 296
See application file for complete search history.

(56) References Cited

U.S. PATENT DOCUMENTS 7,869,775 B2   1/2011  Alon et al.
9,429,975 B2 *  8/2016  Alon .................... G05F 3/20

\* cited by examiner

*Primary Examiner* — Hieu P Nguyen
(74) *Attorney, Agent, or Firm* — Foley & Lardner LLP; Cliff Z. Liu (57) ABSTRACT

The present disclosure relates to a logic control circuit including a first inverter and a voltage limiter. The first inverter is connected to a first input voltage. The first inverter includes a first transistor having a first terminal and a second terminal. The second terminal of the first transistor is connected to a ground. The voltage limiter includes a second transistor. The second transistor has a gate connected to a ground, a source connected to the first terminal of the first transistor and a drain connected to a second input voltage.

16 Claims, 9 Drawing Sheets

FIG. 4

LOGIC CONTROL CIRCUIT

BACKGROUND

1. Technical Field

The present disclosure relates to a logic control circuit, and to a logic control circuit for a power amplifier.

2. Description of the Related Art

A power amplifier is a circuit in a wireless transceiver that can amplify a signal to be transmitted. The power amplifier can be turned on/off through a logic level of a signal received from a logic control circuit. When the power amplifier is used for mobile devices (such as a cell phone, a tablet or a notebook), it may be desirable to make the power consumption of the power amplifier and the control circuit relatively low. Reducing a leakage current of transistors of the power amplifier can reduce the power consumption of the power amplifier. However, using a relatively large resistor (e.g., a 1 mega ohm (M ohm) or larger resistor) to reduce the leakage current may increase the die/chip area.

SUMMARY

In accordance with an aspect of the present disclosure, a logic control circuit includes a first inverter and a voltage limiter. The first inverter is connected to a first input voltage. The first inverter includes a first transistor having a first terminal and a second terminal. The second terminal of the first transistor is connected to a ground. The voltage limiter includes a second transistor. The second transistor has a gate connected to a ground, a source connected to the first terminal of the first transistor and a drain connected to a second input voltage.

In accordance another aspect of the present disclosure, a power amplifier module includes a logic control circuit and an amplifier circuit. The logic control circuit includes a first inverter and a voltage limiter. The first inverter is connected to a first input voltage. The first inverter includes a first transistor having a first terminal and a second terminal. The second terminal of the first transistor is connected to a ground. The voltage limiter includes a second transistor. The second transistor has a gate connected to a ground, a source connected to the first terminal of the first transistor and a drain connected to a second input voltage. The amplifier circuit is configured to receive a signal from the logic control circuit.

In accordance another aspect of the present disclosure, a mobile device includes a case, a logic control circuit disposed within the case and an amplifier circuit disposed within the case. The logic control circuit includes a first inverter and a voltage limiter. The first inverter is connected to a first input voltage. The first inverter includes a first transistor having a first terminal and a second terminal. The second terminal of the first transistor is connected to a ground. The voltage limiter includes a second transistor. The second transistor has a gate connected to a ground, a source connected to the first terminal of the first transistor and a drain connected to a second input voltage. The amplifier circuit is configured to receive a signal from the logic control circuit.

Common reference numerals are used throughout the drawings and the detailed description to indicate the same or similar components. The present disclosure can be readily understood from the following detailed description taken in conjunction with the accompanying drawings.

DETAILED DESCRIPTION

Although described with particular reference to a portable transceiver, the circuit and method for biasing a gallium arsenide (GaAs) power amplifier (also referred to as the GaAs bias circuit) can be implemented in any GaAs device in which it is desirable to provide a bias current or voltage. Furthermore, the circuitry described below can be fabricated using an integrated bipolar-field effect transistor (BIFET) process or integration of a heterojunction bipolar transistor (HBT) with a pseudomorphic high electron mobility transistor (pHEMT) (BiHEMT) process, utilizing the lower turn-on voltage of field effect transistors. Furthermore, in particular embodiments, the transistors to be described below include bipolar junction transistors (referred to as a BJT), which includes heterojunction bipolar junction transistors (referred to as an HBT) and field effect transistors (referred to as a FET) or pseudomorphic high-electron mobility transistor (referred to as a pHEMT) that are fabricated using what is referred to as the BIFET process.

As used herein, reference to a gate, source, drain, or other component of a transistor or other circuit component being connected to a gate, source, drain, or other component of another transistor or other circuit component can refer to a direct connection, or to a connection with another circuit component (e.g. a transistor) disposed therebetween.

Figure 1A:
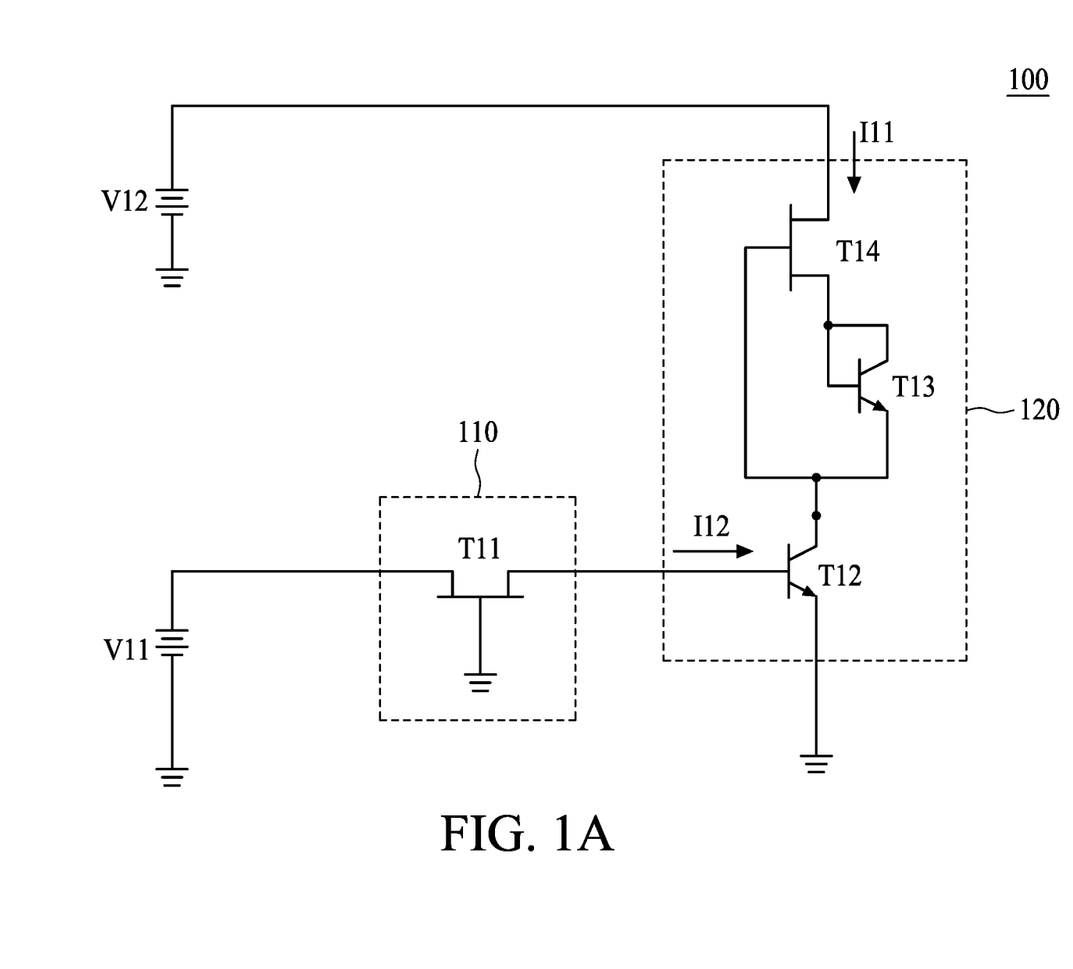
FIG. 1A is a schematic diagram illustrating a logic control circuit in accordance with some embodiments of the present disclosure.

FIG. 1A is a schematic diagram illustrating a logic control circuit 100 in accordance with some embodiments of the present disclosure. The logic control circuit 100 includes a voltage limit circuit 110 (or a voltage limiter) and an inverter 120.

The voltage limit circuit 110 includes a transistor T11 having a drain connected to an input voltage V11, a gate connected to a ground and a source connected to the inverter 120. In some embodiments, the transistor T11 is a depletion mode (D-mode) pHEMT, and thus the transistor T11 can limit the voltage of an input of the inverter 120 (e.g., a base of a transistor T12 of the inverter 120) to a predetermined voltage. For example, if a pinch-off voltage of the transistor T11 is about 1V, the voltage of the input of the inverter 120 can be limited to about 1V. Further, the voltage limit circuit 110 can be configured to limit a current I12 provided to the input of the inverter 120 to less than about 0.1 microamperes (μA) (e.g. to less than about 0.095 μA, to less than about 0.090 μA, or to less than about 0.085 μA), which can limit the input current of the logic control circuit 100.

The inverter 120 includes the transistor T12 and the transistors T13 and T14. In some embodiments, the transistors T12 and T13 are BJTs and the transistor T14 is a D-mode pHEMT. In some embodiments, the transistor T12 is an HBT or a pHEMT depending on design specifications. The transistor T12 has a base connected to the source of the transistor T11 of the voltage limit circuit 110, an emitter connected to a ground and a collector connected to an emitter of the transistor T13 and a gate of the transistor T14. The transistor T13 has a base and a collector both connected to a source of the transistor T14. In some embodiments, the transistor T13 can be used as a diode. The transistor T14 has a drain connected to a power source (or input voltage) V12 (or to a power supply).

In some implementations, the transistor T12 can be replaced by an enhanced-mode (E-mode) FET or pHEMT. However, the noise margin of the E-mode EFT is relatively low (about 0.3V), which may adversely affect the functioning of the inverter. As shown in FIG. 1A, since the noise margin of an HBT is relatively high (about 1.1V), the inverter 120 can withstand a relatively high amount of noise by using an HBT (e.g. the transistor T12) as the input of the inverter 120. In some embodiments, the transistors T13 and T14 can act as an active load and a current limiter to reduce a current I11 of the inverter 120. In some embodiments, the current I11 of the inverter 120 is about 0.7 μA. In some implementations, the transistors T13 and T14 can be replaced by a large resistor (e.g., about 1 M ohm). However, such a large resistor may occupy a large area of the chip/die, which can hinder miniaturization of the chip/die. By using the transistors T13 and T14 to replace the large resistor, the total area of the chip/die can be reduced.

Figure 1B:
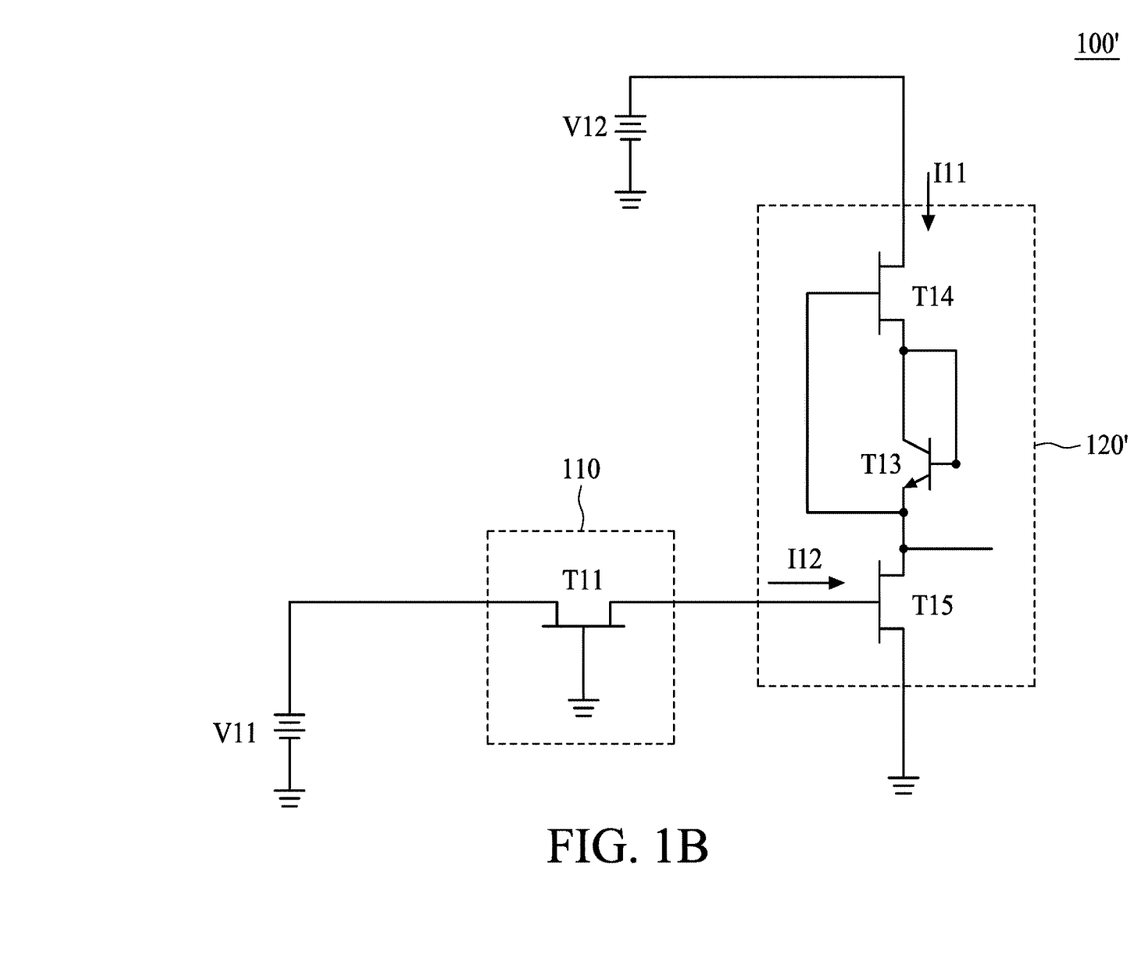
FIG. 1B is a schematic diagram illustrating a logic control circuit in accordance with some embodiments of the present disclosure.

FIG. 1B is a schematic diagram illustrating a logic control circuit 100' in accordance with some embodiments of the present disclosure. The logic control circuit 100' in FIG. 1B is similar to the logic control circuit 100 in FIG. 1A, except that the transistor T15 of the inverter 120' in FIG. 1B is an E-mode pHEMT used in place of the HBT T12 of the inverter 120 in FIG. 1A.

Figure 2A:
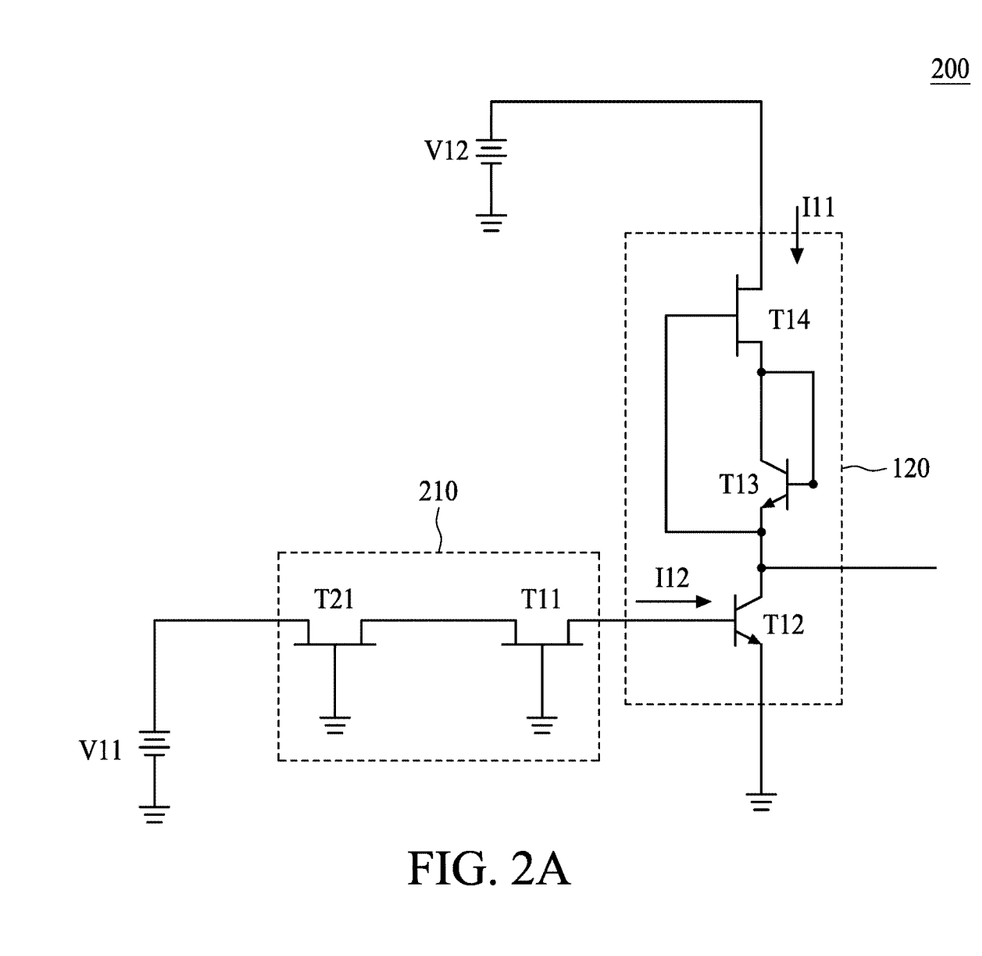
FIG. 2A is a schematic diagram illustrating a logic control circuit in accordance with some embodiments of the present disclosure.

FIG. 2A is a schematic diagram illustrating a logic control circuit 200 in accordance with some embodiments of the present disclosure. The logic control circuit 200 in FIG. 2A is similar to the logic control circuit 100 in FIG. 1A, except that the voltage limit circuit 210 of the logic control circuit 200 includes two transistors T11 and T21. The transistor T21 includes a drain connected to an input voltage V11, a gate connected to a ground and a source connected to a drain of the transistor T11. A gate of the transistor T11 is connected to a ground and a source of the transistor T11 is connected to the inverter 120 (e.g., connected to the base of the transistor T12). Compared to the voltage limit circuit 110 in FIG. 1A, using two transistors connected in series as shown in FIG. 2A can further limit the current provided to the input of the inverter 120, which can reduce the input current of the inverter 120. In some embodiments, the voltage limit circuit 210 may include more than two transistors connected in series depending on design specifications.

Figure 2B:
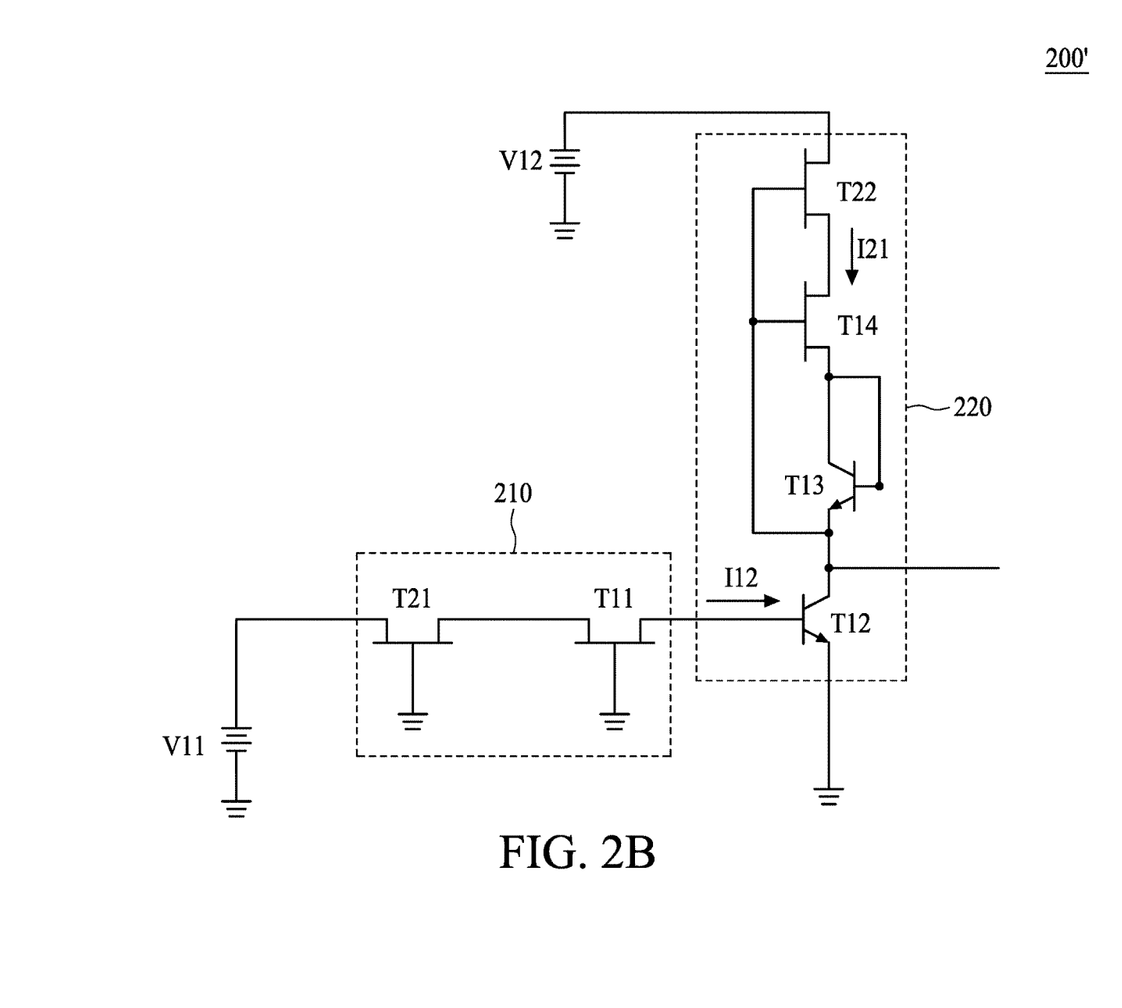
FIG. 2B is a schematic diagram illustrating a logic control circuit in accordance with some embodiments of the present disclosure.

FIG. 2B is a schematic diagram illustrating a logic control circuit 200' in accordance with some embodiments of the present disclosure. The logic control circuit 200' in FIG. 2B is similar to the logic control circuit 200 in FIG. 2A, except that the inverter 220 of the logic control circuit 200 further includes a transistor T22. A drain of the transistor T22 is connected to the power source V12. A gate of the transistor T22 is connected to the gate of the transistor T14, the emitter of the transistor T13 and the collector of the transistor T12. A source of the transistor T22 is connected to the drain of the transistor T14. In some embodiments, the transistor T22 is a D-mode pHEMT. Compared to the inverter 120 in FIG. 2A, disposing the additional transistor T22 connected to the transistor T14 can further limit the current I21 (e.g., to less than about 0.5 μA, such as to less than about 0.45 μA or to less than about 0.4 μA) of the inverter 220, which can reduce the power consumption of the inverter 220.

Figure 3A:
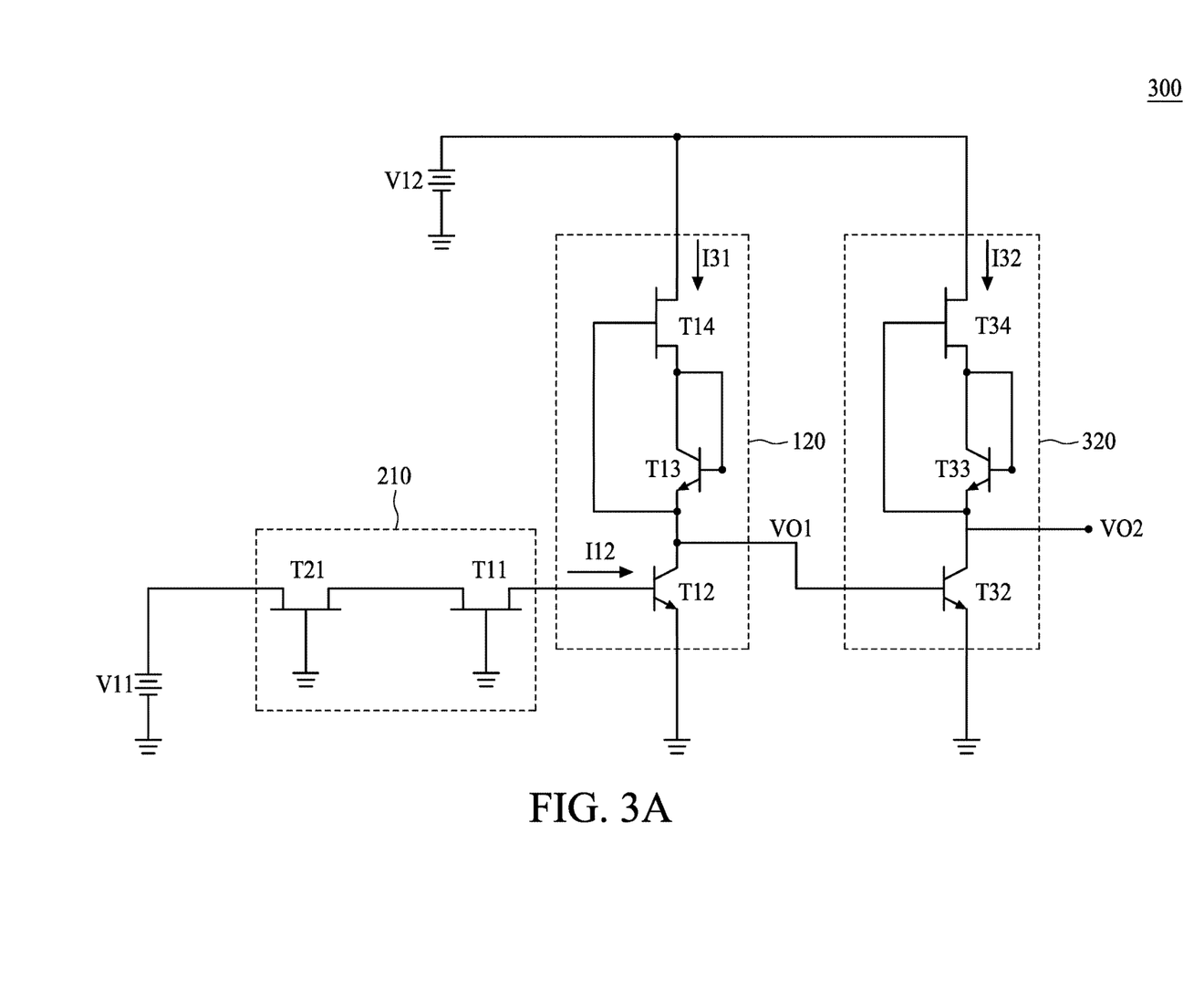
FIG. 3A is a schematic diagram illustrating a logic control circuit in accordance with some embodiments of the present disclosure.

FIG. 3A is a schematic diagram illustrating a logic control circuit 300 in accordance with some embodiments of the present disclosure. The logic control circuit 300 in FIG. 3A is similar to the logic control circuit 200 in FIG. 2A, except that the logic control circuit 300 further includes an inverter 320 connected to the inverter 120.

In some embodiments, the inverter 320 has a same configuration as the inverter 120. Alternatively, the inverter 320 can have a different configuration than the inverter 120. For example, the inverter 320 can have the same configuration as the inverter 220 as shown in FIG. 2B. The inverter 320 includes transistors T32, T33 and T34. In some embodiments, the transistors T32 and T33 are BJTs and the transistor T34 is a D-mode pHEMT. In some embodiments, the transistor T32 is an HBT or a pHEMT depending on design specifications. A base of the transistor T32 is connected to the collector of the transistor T12, an emitter of the transistor T32 is connected to a ground and a collector of the transistor T32 is connected to an emitter of the transistor T33 and a gate of the transistor T34 and may be connected to a node that represents an output of the inverter 320 having a voltage V02. A base and a collector of the transistor T33 are both connected to a source of the transistor T34. A drain of the transistor T34 is connected to the power source V12 (or to a power supply).

Figure 3B:
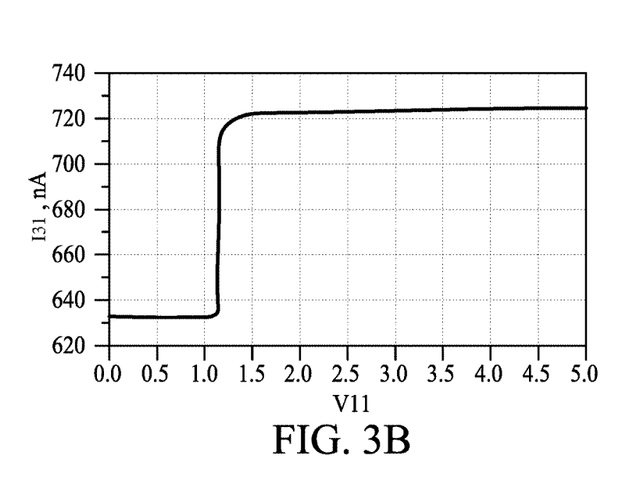
FIG. 3B, FIG. 3C, FIG. 3D and FIG. 3E illustrate simulation results of the logic control circuit in FIG. 3A in accordance with some embodiments of the present disclosure.
Figure 3C:
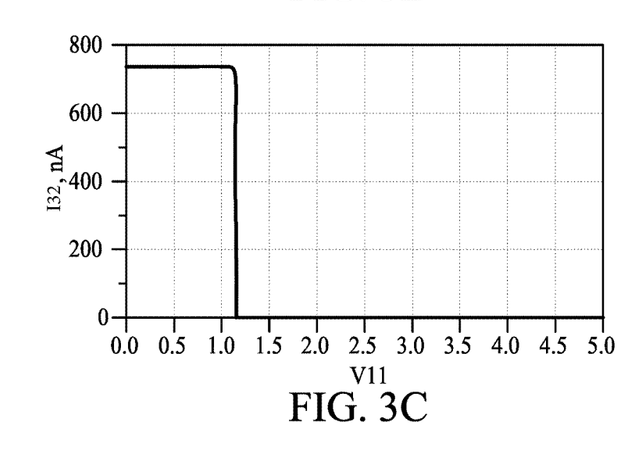
Figure 3D:
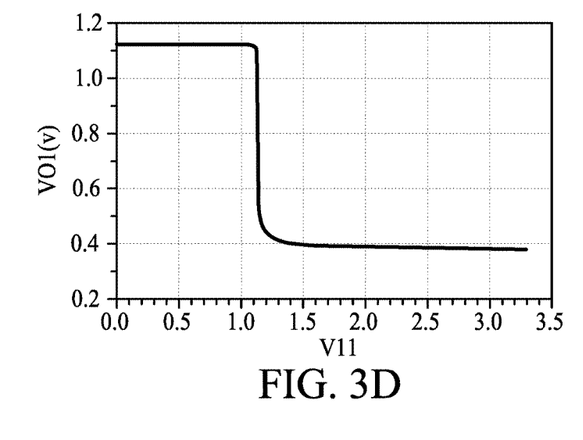
Figure 3E:
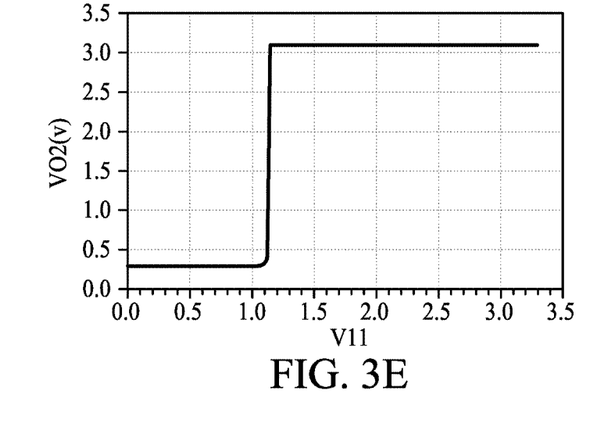

FIG. 3B, FIG. 3C, FIG. 3D and FIG. 3E illustrate simulation results of the logic control circuit 300 in FIG. 3A in accordance with some embodiments of the present disclosure. In FIG. 3B, the x-axis represents the voltage (V) of the input voltage V11 applied to the transistor T21 and y-axis represents the current I31 of the inverter 120. In FIG. 3C, x-axis represents the voltage V11 (V) applied to the transistor T21 and y-axis represents the current I32 of the inverter 320. In FIG. 3D, the x-axis represents the voltage (V) of the input voltage V11 applied to the transistor T21 and y-axis represents the voltage VO1 of the inverter 120. In FIG. 3E, the x-axis represents the voltage (V) of the input voltage V11 applied to the transistor T21 and y-axis represents the voltage VO2 of the inverter 320.

In the case that the voltage of the input voltage V11 is low (e.g., less than about 1.1V), the transistor T12 is turned off and substantially no current flows through the transistor T12. The current I31 flows through the transistors T13 and T14 and to the base of the transistor T32 to turn on the transistor T32 to draw the current I32 through the transistors T33 and T34. In this case, as shown in FIGS. 3B and 3C, the current I31 is about 630 nA and the current I32 is about 720 nA. The total current from the power source V12 is about 1.3 μA. In addition, as shown in FIGS. 3D and 3E, the output voltage VO1 of the inverter 120 is about 1.1V and the output voltage VO2 of the inverter 320 is about 0.3V.

In the case that the voltage of the input voltage V11 is high (e.g., more than 1.1V), the transistor T12 is turned on and the current I31 flows through the transistors T12, T13 and T14. The transistor T32 is turned off and substantially no current flows through the transistors T32, T33 and T34. In this case, as shown in FIGS. 3B and 3C, the current I31 is about 720 nA and the current I32 is 0 nA. The total current from the power source V12 is about 0.7 µA. Thus, as shown in FIGS. 3B and 3C, regardless of the voltage level of the input voltage V11, the total current of the two-stage inverter in FIG. 3A is equal to or less than about 1.3 µA (e.g. is in a range of about 0.7 µA to about 1.3 µA). In addition, as shown in FIGS. 3D and 3E, in the case that the voltage of the input voltage V11 is high (e.g., more than 1.1V), the output voltage VO1 of the inverter 120 is about 0.4V and the output voltage VO2 of the inverter 320 is about 3.1V.

Figure 4:
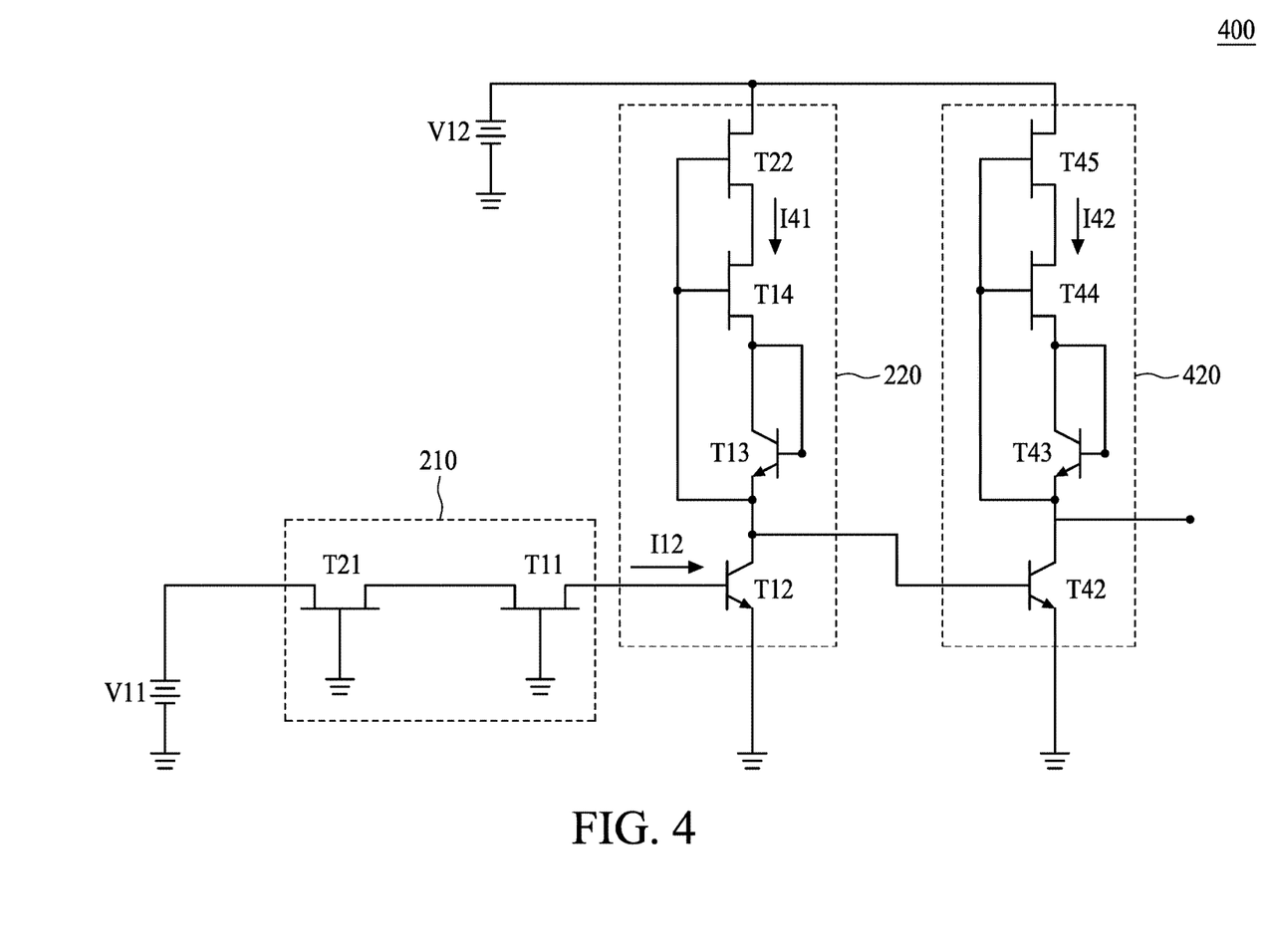
FIG. 4 is a schematic diagram illustrating a logic control circuit in accordance with some embodiments of the present disclosure.

FIG. 4 is a schematic diagram illustrating a logic control circuit 400 in accordance with some embodiments of the present disclosure. The logic control circuit 400 in FIG. 4 is similar to the logic control circuit 200' in FIG. 2B, except that the logic control circuit 400 further includes an inverter 420 connected to the inverter 220.

In some embodiments, the inverter 420 has the same configuration as the inverter 220. Alternatively, the inverter 420 can have a different configuration than the inverter 220. For example, the inverter 420 can be the same as the inverter 120 as shown in FIG. 1A. The inverter 420 includes transistors T42, T43, T44 and T45. In some embodiments, the transistors T42 and T43 are BJTs and the transistors T44 and T45 are D-mode pHEMTs. In some embodiments, the transistor T42 is an HBT or a pHEMT depending on design specifications. A base of the transistor T42 is connected to the collector of the transistor T12, an emitter of the transistor T42 is connected to a ground and a collector of the transistor T42 is connected to an emitter of the transistor T43, a gate of the transistor T44 and a gate of the transistor T45. A base and a collector of the transistor T43 are both connected to a source of the transistor T44. A drain of the transistor T44 is connected to a source of the transistor T45. A drain of the transistor T45 is connected to the power source V12 (or to a power supply). Compared to the logic control circuit in FIG. 3A, disposing the additional transistors T22 and T45 connected to the transistors T14 and T44 can further limit the current (e.g., to less than about 0.5 µA, such as to less than about 0.45 µA or to less than about 0.4 µA) drawn from the power source V12, which can further reduce the power consumption of the logic control circuit 400.

In accordance with some embodiments of the present disclosure, the inverter 120 in FIG. 1A, the inverter 120' in FIG. 1B and the inverter 220 in FIG. 2B can be implemented in many kinds of logic circuits, such as an AND/NAND gate, an OR/NOR gate, a latch, a flip-flop and the like. Since the inverters 120, 120' and/or 220 as shown in FIGS. 1A, 1B and 2B can use relatively low current, using the inverters 120, 120' and/or 220 as shown in FIGS. 1A, 1B and 2B to define a logic circuit can reduce the power consumption of the logic circuit. In addition, by using the current limiter (e.g., the transistors T13 and T14 in FIG. 1A) to replace a large resistor, the total area of the chip/die can be reduced.

Figure 5:
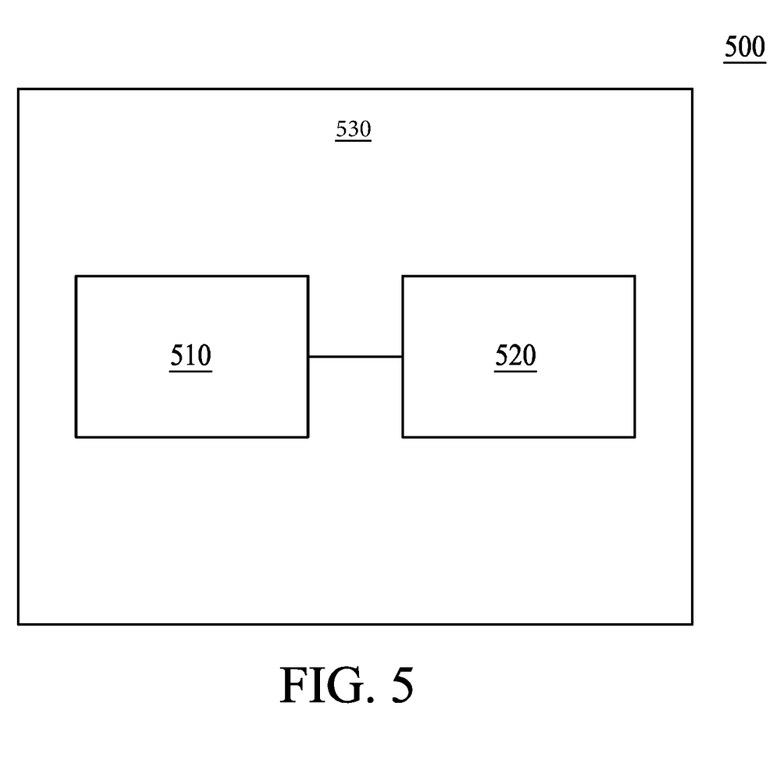
FIG. 5 illustrates a block diagram of a mobile device in accordance with some embodiments of the present disclosure.

FIG. 5 illustrates a block diagram of a mobile device 500 or a portion of the mobile device 500 in accordance with some embodiments of the present disclosure. In some embodiments, the mobile device 500 may be a cell phone, a tablet, a notebook and the like. The mobile device 500 may include a transceiver having a logic control circuit 510 and a power amplifier 520 controlled by the logic control circuit 510. The power amplifier 520 may be a GaAs power amplifier. The mobile device 500 may include a case 530 in which the logic control circuit 510 and the power amplifier 520 are disposed. In some embodiments, the logic control circuit 510 may include any of the logic control circuits 100, 100', 200, 200', 300 or 400 in FIG. 1A, FIG. 1B, FIG. 2A, FIG. 2B, FIG. 3A or FIG. 4 or a combination thereof. For example, the output of the logic control circuit 510 which is connected to the input of the power amplifier 520 is the collector of the transistor T12 in FIG. 1A. For example, the output of the logic control circuit 510 which is connected to the input of the power amplifier 520 can be the drain of the transistor T15 in FIG. 1B. For example, the output of the logic control circuit 510 which is connected to the input of the power amplifier 520 can be the collector of the transistor T32 in FIG. 3A. For example, the output of the logic control circuit 510 which is connected to the input of the power amplifier 520 can be the collector of the transistor T42 in FIG. 4.

As mentioned above, by using the logic control circuits 100, 100', 200, 200', 300 or 400 in FIG. 1A, FIG. 1B, FIG. 2A, FIG. 2B, FIG. 3A or FIG. 4 as the logic control circuit 510 for the power amplifier 520, the power consumption and the total area of the logic control circuit 510 can be reduced.

As used herein, the singular terms "a," "an," and "the" may include a plurality of referents unless the context clearly dictates otherwise.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "approximately" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A logic control circuit comprising:
a first inverter connected to a first input voltage, the first inverter comprising a first transistor comprising a first terminal and a second terminal, the second terminal of the first transistor connected to ground; and
a voltage limiter comprising a second transistor, the second transistor comprising a gate connected to ground, a source connected to the first terminal of the first transistor and a drain connected to a second input voltage,
wherein the voltage limiter further comprises a third transistor between the second transistor and the second input voltage, and the third transistor comprises a gate connected to ground, a source connected to the drain of the second transistor and a drain connected to the second input voltage.

2. The logic control circuit of claim 1, wherein the first terminal of the first transistor is a gate and the second terminal of the first transistor is a source.

3. The logic control circuit of claim 1, wherein the first transistor is a bipolar transistor, and the first terminal of the first transistor is a base and the second terminal of the first transistor is an emitter.

4. The logic control circuit of claim 3, wherein
the first transistor comprises a third terminal;
the first inverter further comprises a current limiter, the current limiter comprising a fourth transistor and a fifth transistor;
an emitter of the fourth transistor is connected to the third terminal of the first transistor and a gate of the fifth transistor; and
a collector and a base of the third transistor are connected to a source of the fifth transistor.

5. The logic control circuit of claim 4, wherein
the current limiter further comprises a sixth transistor;
a source of the sixth transistor is connected to a drain of the fifth transistor;
a gate of the sixth transistor is connected to the gate of the fifth transistor; and
a drain of the sixth transistor is connected to the first input voltage.

6. The logic control circuit of claim 3, further comprising a second inverter, the second inverter comprising a fourth transistor, wherein a base of the fourth transistor is connected to a collector of the first transistor of the first inverter.

7. The logic control circuit of claim 6, wherein
the second inverter further comprises a current limiter, the current limiter comprising a fifth transistor and a sixth transistor;
an emitter of the fifth transistor is connected to a collector of the fourth transistor and a gate of the sixth transistor; and
a collector and a base of the fifth transistor are connected to a source of the sixth transistor.

8. The logic control circuit of claim 7, wherein
the current limiter further comprises a seventh transistor;
a source of the seventh transistor is connected to a drain of the sixth transistor;
a gate of the seventh transistor is connected to the gate of the sixth transistor; and
a drain of the seventh transistor is connected to the first input voltage.

9. The logic control circuit of claim 1, wherein the first transistor is a heterojunction bipolar transistor (HBT).

10. The logic control circuit of claim 1, wherein the first transistor is a pseudomorphic high-electron mobility transistor (pHEMT).

11. A power amplifier module comprising:
a logic control circuit comprising:
a first inverter connected to a first input voltage, the first inverter comprising a first transistor comprising a first terminal, a second terminal, and a third terminal, the second terminal of the first transistor connected to ground;
a voltage limiter comprising a second transistor, the second transistor comprising a gate connected to ground, a source connected to the first terminal of the first transistor and a drain connected to a second input voltage; and
an amplifier circuit configured to receive a signal from the logic control circuit,
wherein the first inverter further comprises a current limiter, the current limiter comprising a third transistor, a fourth transistor, and a fifth transistor,
an emitter of the third transistor is connected to the third terminal of the first transistor and a gate of the fourth transistor,
a collector and a base of the third transistor are connected to a source of the fourth transistor, and
a source of the fifth transistor is connected to a drain of the fourth transistor, a gate of the fifth transistor is connected to the gate of the fourth transistor, and a drain of the fifth transistor is connected to the first input voltage.

12. The power amplifier module of claim 11, wherein the first terminal of the first transistor is a gate and the second terminal of the first transistor is a source.

13. The power amplifier module of claim 11, wherein the first transistor is a bipolar transistor, and the first terminal of the first transistor is a base and the second terminal of the first transistor is an emitter.

14. A mobile device comprising:
a case;
a logic control circuit disposed within the case, the logic control circuit comprising:
a first inverter connected to a first input voltage, the first inverter comprising a first transistor comprising a first terminal, a second terminal, and a third terminal, the second terminal of the first transistor connected to ground; and
a voltage limiter comprising a second transistor, the second transistor comprising a gate connected to ground, a source connected to the first terminal of the first transistor and a drain connected to a second input voltage; and
an amplifier circuit disposed within the case and configured to receive a signal from the logic control circuit, wherein the first inverter further comprises a current limiter, the current limiter comprising a third transistor, a fourth transistor, and a fifth transistor, an emitter of the third transistor is connected to the third terminal of the first transistor and a gate of the fourth transistor, a collector and a base of the third transistor are connected to a source of the fourth transistor, and a source of the fifth transistor is connected to a drain of the fourth transistor, a gate of the fifth transistor is connected to the gate of the fourth transistor, and a drain of the fifth transistor is connected to the first input voltage.

15. The mobile device of claim 14, wherein the first terminal of the first transistor is a gate and the second terminal of the first transistor is a source.

16. The mobile device of claim 14, wherein the first transistor is a bipolar transistor, and the first terminal of the first transistor is a base and the second terminal of the first transistor is an emitter.

* * * * *